United States Patent
Voutsas et al.

(10) Patent No.: US 6,579,425 B2
(45) Date of Patent: Jun. 17, 2003

(54) SYSTEM AND METHOD FOR FORMING BASE COAT AND THIN FILM LAYERS BY SEQUENTIAL SPUTTER DEPOSITING

(75) Inventors: Apostolos Voutsas, Vancouver, WA (US); Yukihiko Nakata, Nara (JP)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/906,881

(22) Filed: Jul. 16, 2001

(65) Prior Publication Data

US 2003/0010624 A1 Jan. 16, 2003

(51) Int. Cl.$^7$ .............................................. C23C 14/35
(52) U.S. Cl. ............................ 204/192.23; 204/192.15; 204/298.25
(58) Field of Search ........................ 204/192.12, 192.15, 204/192.23, 298.07, 298.13, 298.25

(56) References Cited

U.S. PATENT DOCUMENTS

| | | | |
|---|---|---|---|
| 4,951,601 A | * 8/1990 | Maydan et al. | 118/719 |
| 5,178,739 A | * 1/1993 | Barnes et al. | 204/192.12 |
| 5,248,630 A | 9/1993 | Serikawa et al. | 437/101 |
| 5,665,210 A | 9/1997 | Yamazaki | 438/3 |
| 5,817,550 A | * 10/1998 | Carey et al. | 438/166 |
| 6,214,482 B1 | * 4/2001 | Jahnes et al. | 428/694 ML |

OTHER PUBLICATIONS

T. Serikawa et al., IEEE Trans. Electron Dev., vol. 36, pp. 1929 (1989).
S. Suyama et al., IEEE Trans. Electron Dev., vol. ED–34, pp. 2124 (1987).
S. Serikawa et al., J. Electrochem. Soc., vol. 131, pp. 2928 (1984).
G. Giust et al., IEEE Electron Dev. Lett., vol. 19, pp. 343 (1998).
D. Gosain et al., Electrochem. Soc. Proc., vol. 98–22, pp. 174 (1998).
F. Okumura et al., Electrochem. Soc. Proc., vol. 98–22, pp. 133 (1998).
K. Kawamura et al., SID 99 Digest, pp. 456 (1999).

* cited by examiner

Primary Examiner—Steven H. VerSteeg
(74) Attorney, Agent, or Firm—David C. Ripma; Matthew E. Rabdau; Scott C. Krieger

(57) ABSTRACT

A system and method are provided to sequentially deposit a silicon dioxide base coat barrier layer adjacent a thin silicon film, to minimize the formation of water and —OH radicals. Both the base coat and thin silicon films are sputter to eliminate hydrogen chemistries. Further, the sputter processes are conducted sequentially, without breaking the vacuum seat to minimize the absorption of water in the base coat layer that conventionally occurs between deposition steps. This process eliminates the total number of process steps required, as there is no longer a need for furnace annealing the base coat before the deposition of the thin silicon film, and no longer a need for a dehydrogenation annealing step after the deposition of the thin silicon film.

30 Claims, 3 Drawing Sheets

SYSTEM AND METHOD FOR FORMING BASE COAT AND THIN FILM LAYERS BY SEQUENTIAL SPUTTER DEPOSITING

BACKGROUND OF THE INVENTION

1. Field of the Invention

This invention generally relates to integrated circuit (IC) fabrication and, more particularly, to a system and method for forming thin films of silicon over a silicon barrier layer by sequential sputter deposition processes.

2. Description of the Related Art

In the manufacture of thin film transistor (TFT) liquid crystal displays (LCDs), the active region of the display consists of an array of pixels, built on a transparent (glass) substrate. The TFTs are in essence optical switches that control the amount of light that is allowed to pass through each pixel before reaching the eye of the viewer(s). TFTs are made using a plurality of typical semiconductor processes, such as deposition, lithography, etching, etc., directly on the glass substrate. Before the TFT fabrication commences, the glass substrate needs to be coated with an appropriate base coat layer, to prevent outdiffusion of impurities, typically present in the glass material, into the TFT layers. The most conventional base coat material is silicon dioxide (SiO2) film. The base coat deposition is usually followed by an annealing (densification) process, to improve the quality of the base coat layer before it comes in contact with subsequently deposited TFT layers.

The need for the annealing step, to improve the material quality, stems from the fact that the water in the barrier base coat layer tends to promote Si—OH bonds. These Si—OH groups lead to the formation of spatially localized (fixed) electrical charges in the base coat that can, in turn, modulate the transistor characteristics, such as threshold voltage and subthreshold slope, when adjacent silicon films are used as transistor active areas. Furthermore impurities on the interface between the base coat layer and the adjoining silicon film may lead to development of interface trap states that will similarly affect the transistor performance. These phenomena are more likely to occur when the adjacent silicon films are thin, such as the silicon films used to form a TFT.

Annealing reduces the amount of water that is trapped in the base coat film. Water in SiO2 films is manifested in two main ways: (1) the number of Si—OH bonds in the film, and (2) the amount of absorbed water in the film upon exposure to ambient. The first source is attributed to the deposition chemistry. That is, the interaction of H, O and Si as the film is formed from precursors such as SiH4 or TEOS. This source can be controlled, to a certain extent, by process optimization, so that the amount of Si—OH bonding configurations is minimized. However, an undesirable amount of Si—OH bonding still occurs. The second source depends upon the physical characteristics of the film, such as porosity, and is difficult to eliminate. Even the densest films will tend to absorb some water upon exposure to the ambient environment after the deposition process.

Another conventional approach used to address the problem of water in the silicon base coat is the formation of a dual base coat layer. When optimized, this process alleviates the need for post-deposition annealing. In this approach, a SiNx/SiO2 stack is deposited. The SiNx layer demonstrates good barrier properties, whereas the SiO2 layer is used to mainly improve the interface quality between the base coat stack and the next TFT layer. This approach, however, requires extra process steps, as two layers must now be deposited. Further, the —OH radicals are not eliminated, merely trapped in the SiO2 film, and the potential still exists for these radicals to create fixed charge groups in the base coat.

It would be advantageous if a TFT, overlying a glass substrate, could be formed with a minimal number of —OH radicals in the silicon dioxide base coat.

It would be advantageous if a TFT silicon dioxide base coat could be formed without the necessity of an annealing step. It would be advantageous if the annealing step could be eliminated without the necessity of a nitride layer interposed between the silicon dioxide layer and a silicon thin film.

It would be advantageous if a TFT silicon dioxide base coat could be deposited with a minimum of hydrogen. It would be advantageous if a thin silicon film could be deposited over the base coat without an intervening process that permits water to be absorbed into the base coat.

SUMMARY OF THE INVENTION

The present invention describes processes for the deposition of thin-film materials used in the fabrication of amorphous silicon (a-Si) or polysilicon (polycrystalline silicon) TFTs. The invention involves the sputtering, or physical vapor deposition (PVD) of active amorphous silicon and polysilicon layers, and adjacent insulating base coat layers of silicon dioxide. These adjacent film layers are used in the fabrication of TFTs, which in turn are key elements of different types of LCDs.

The present invention minimizes the formation of Si—OH groups in the oxide barrier layer, significantly improving the quality of the barrier layer. This improvement is accomplished by sputtering the base coat layer and overlying thin silicon film sequentially, to inhibit water absorption. In this manner, the annealing steps, currently employed in conventional TFT fabrication processes to improve the electrical characteristics of the base coat layer, can be eliminated.

Accordingly, in the fabrication of TFTs, a method is provided for forming a thin film of silicon overlying a base coat in a continuous process. The method generally comprises: forming a vacuum seal; sputter depositing a silicon dioxide barrier layer; and, without breaking the vacuum seal, sputter depositing a thin film of amorphous or polycrystalline silicon overlying the barrier layer. More specifically, in the context of forming a TFT for use in an LCD, the method further comprises introducing a glass substrate. Then, sputter depositing a barrier layer includes sputter depositing a silicon dioxide base coat overlying the glass substrate.

The base coat is deposited using either a direct current (DC) magnetron sputtering or a radio frequency (RF) sputtering process. When the DC magnetron process is used, an atmosphere is established that includes argon and oxygen. In some aspects of the invention Ar can be replaced by another inert gas such as Ne and Kr. In some other aspects of the invention additional gases such as He and hydrogen can be also used. The target is either a single-crystal silicon, polycrystalline silicon, or doped silicon material. When an RF sputtering process in used, an atmosphere is established that includes Ar and oxygen, and sometimes helium. A silicon target or a silicon dioxide compound target is used.

The silicon thin film is deposited with a DC magnetron process in an atmosphere of Ar, using a target material of single-crystal silicon, polycrystalline silicon, or doped silicon. In other aspects of the invention a mixture of He and Ar can be used for the deposition of the thin silicon film.

Additional details of the above-described sputtering deposition process and a system for forming a TFT base coat layer and silicon thin film in a continuous sputtering process are provided below.

DETAILED DESCRIPTION OF THE PREFERRED EMBODIMENTS

Figure 1:
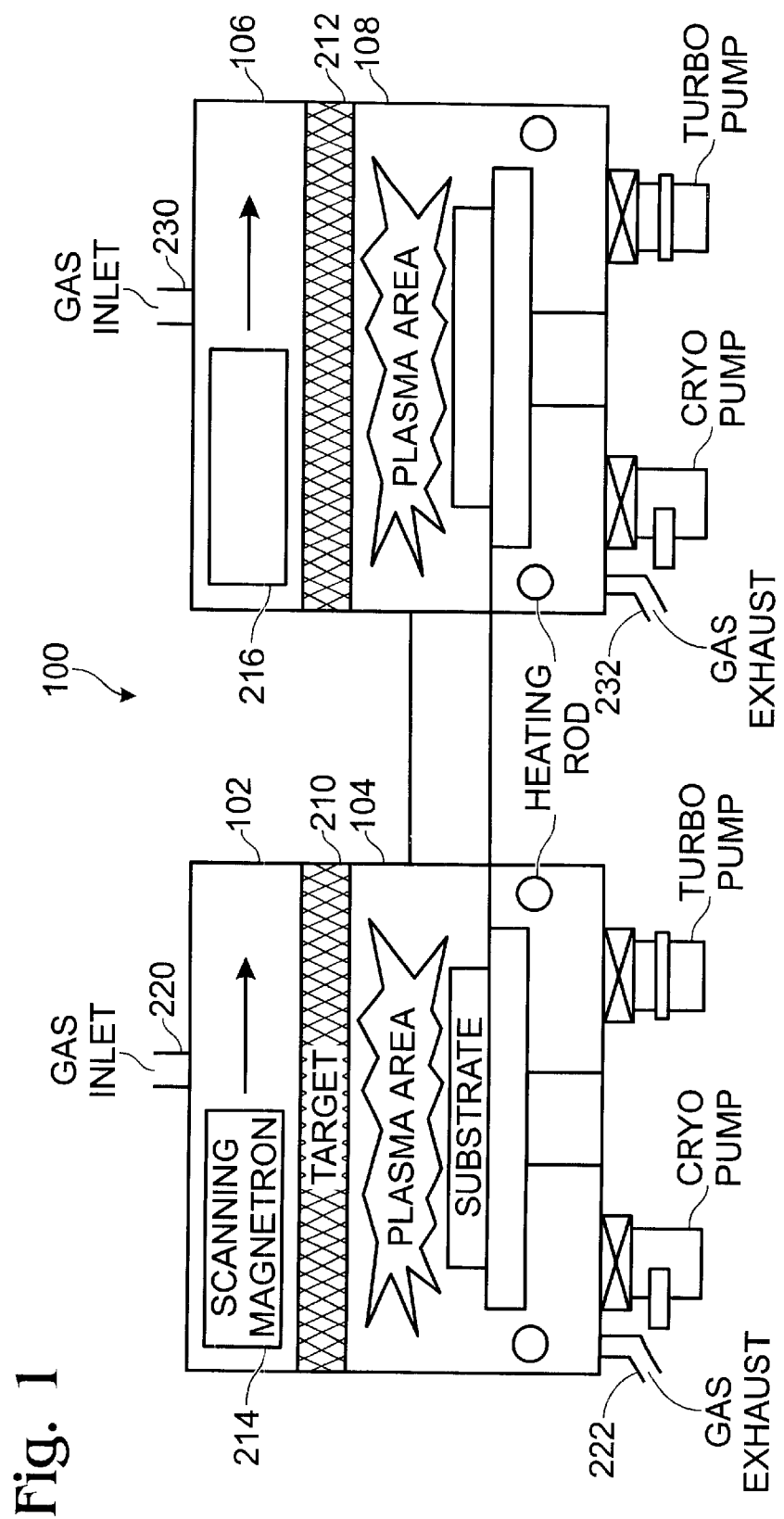
FIG. 1 is a block diagram of the present invention system for forming a barrier layer and a thin film of silicon in a continuous process, such as used in the fabrication of TFTs.

FIG. 1 is a block diagram of the present invention system for forming a barrier layer and a thin film of silicon in a continuous process, such as used in the fabrication of TFTs. The system 100 comprises a first chamber 102 for sputter depositing a barrier layer. Although a direct current (DC) magnetron is shown, a radio frequency (RF) sputtering device provides equivalent results. The first chamber 102 has an atmosphere maintained at a first base pressure, and a load/unload port 104. A second chamber 106 is used for the deposition of a thin film of silicon. Typically, the second chamber uses a DC magnetron device. The second chamber 106 has an atmosphere maintained at the first base pressure and a load/unload port 108 connected to the first chamber load/unload port 104, to permit communication between the first chamber 104 and the second chamber 106 without breaking the seal of the first base pressure vacuum. That is, the base pressure need not necessarily be equal in the two chambers, but rather the processes in the two chambers must be conducted without breaking the vacuum seal, giving no opportunity for water to be absorbed into the deposited barrier layer.

Generally, the system has applications for forming a barrier layer adjacent a thin film of silicon, and the film layers are not limited to any particular film order. Typically, however, the second chamber 106 sputter deposits a thin film of silicon overlying the barrier layer formed in the first chamber 102. When an LCD is the ultimate object of manufacture, the TFT is formed on a glass substrate. Then, a glass substrate is provided, and the first chamber deposits a base coat barrier layer overlying the glass substrate. Typically, the second chamber 106 deposits a thin film of either amorphous silicon (a-Si) or polysilicon (p-Si).

Figure 2:
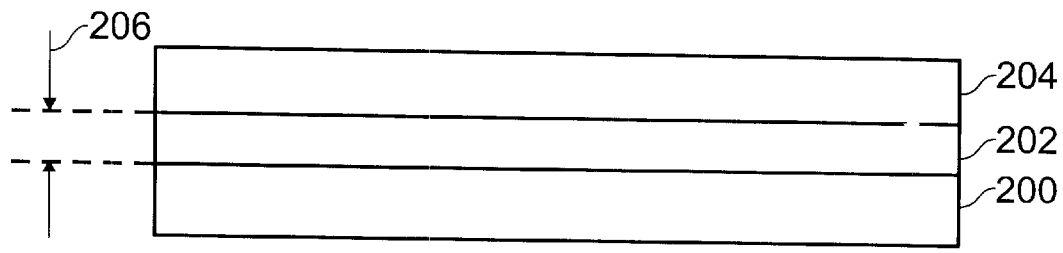
FIG. 2 is a partial cross-sectional view of the film layers formed in the present invention system.

FIG. 2 is a partial cross-sectional view of the film layers formed in the present invention system. As shown, the film layers are supported by a glass substrate 200. Overlying the glass substrate 200 is the base coat barrier layer 202, hereafter referred to the base coat. Typically, the base coat is silicon dioxide. Overlying the base coat 202 is the thin film of silicon 204. The first chamber deposits a base coat of silicon dioxide having a thickness 206 in the range of 100 to 1000 nanometers (nm). Preferably, the thickness 206 is in the range of 100 to 500 nanometers nm. Even more preferably, the thickness 206 is in the range of 100 to 300 nanometers nm.

Returning to FIG. 1, the load/unload ports 104/108 of the first and second chambers 102/106 can be connected through a connecting chamber able to maintain the vacuum seal. Alternately, the chambers are more directly connected, such as in an "in-line" system where substrates are transferred from one deposition module (chamber) to the next without passing through an intermediate deposition station. The connection means is not critical, as long as a transfer can be made between chambers without breaking the vacuum seal. The substrate can be moved by conveyers, robotic arms, or the equivalence, the conveyance means is not critical to the invention.

In some aspects of the invention, the base coat 202 and thin film silicon layer 204 (see FIG. 2) are formed in the same chamber (not shown). However, a single chamber system would require cleaning, after the silicon dioxide barrier layer deposition, and before the silicon film deposition.

One of the key aspects of the silicon-sputtering process is the target component. The first chamber 102 has a target 210, and the second chamber 106 has a target 212. The targets 210/212 are blocks of the material to be deposited. Each of the targets 210/212 is mounted on an appropriate metal backing plate (not shown), and placed opposite to the substrate 200 (see FIG. 2) where the film is to be deposited. Describing the first chamber process, although an analogous description applies to the second chamber 106, plasma strikes in the gap between the target 210 and the substrate 200. First chamber magnet 214 (the second chamber 106 has a magnet 216) scans above the target backing plate, and is used to intensify the plasma and confine it in the region defined by the magnetic field. By scanning the magnet 214, the plasma is swept across the surface of the target 210, resulting in deposition of the base coat 202 on the substrate 200 opposite to the target 214. The plasma is generated by applying high voltage to an inert gas that flows in the region between the target 214 and the substrate 200. For certain applications, other gases may be mixed to the inert gas to alter the composition and/or the properties of the sputtered film.

The first chamber also includes a gas introduction port 220 and gas exhaust port 222. When a DC magnetron device is used in the first chamber 102, the gas ports 220/222 are used to supply a first chamber atmosphere including argon and oxygen. In some aspects of the invention Ar can be replaced by another inert gas such as Ne and Kr. In some other aspects of the invention, the first chamber gas introduction port 220 and gas exhaust port 222 supply an atmosphere additionally including helium to reduce the plasma voltage and alleviate the plasma damage to the sputtered dielectric film. In yet other aspects of the invention, the atmosphere optionally includes the addition of hydrogen to passivate dangling bonds that are generated within the sputtered dielectric film during deposition.

With sputtering, plasma strikes between the substrate and the block of target material to be deposited. The plasma typically consists of ionized Ar (or equivalent) gas. However, He/Ar mixtures are also very effective. Under the influence of the electric field between the target and the substrate, the ionized species are accelerated towards the target and impart part of their energy to atoms of the target material. As a result of this interaction, some of the host atoms are ejected from the target body and are deposited onto the substrate.

The first chamber DC magnetron device target 214 is a material selected from the group of materials including single-crystal silicon, polycrystalline silicon, and doped silicon. Typically, the doped silicon is a p-doped material having a resistivity in the range of 1 to 500 ohms per centimeter.

When the first chamber tool is an RF sputtering device, the gas introduction port 220 and gas exhaust port 222 supply a first chamber atmosphere including Ar and oxygen. In some aspects of the invention, the atmosphere optionally includes the addition of helium. The first chamber RF sputtering device target is made from a silicon or silicon dioxide material.

Likewise, the second chamber 106 has a gas introduction port 230 and gas exhaust port 232 to supply an atmosphere including either argon (Ar), or helium and Ar, for use in conjunction with the second chamber DC magnetron device. The second chamber DC magnetron device target 212 is either a single-crystal silicon, polycrystalline silicon, or doped silicon material. When a doped silicon is used, it is typically a p-doped material having a resistivity in the range of 1 to 500 ohms per centimeter.

The percentage of Ar varies in response to the optimization objectives for each layer. The reduced plasma voltage, afforded by the He sputtering gas, is beneficial in the deposition of dielectric films. Plasma damage is typically responsible for the introduction of fixed charges in the insulating films. Therefore, lower plasma voltages reduce the plasma damage and, hence, increase the quality of the dielectric layer. The He/Ar ratios used to deposit a base coat in the first chamber 102 may vary from the ratio used to form the silicon film layer in the second chamber 106.

As described above, the present invention system 100 uses a sputtering, or PVD process to deposit a $SiO_2$ film for the base coat layer. Since sputtering is a physical deposition process, no chemistry is used in the deposition. Hence, no H-bearing species are formed that, when combined with O atoms, can produce —OH groups.

Sputtering is a well-suited method for the formation of the various Si-based TFT layers because:

1. it is a safe and environmentally benign technique;
2. it can be used even at room temperature and is, thus, compatible with any kind of substrate;
3. silicon films with very low H2 content can be typically deposited. Hence, there is no need for dehydrogenation to release excessive hydrogen. Alternatively, hydrogen can be incorporated into the film if, and when necessary;
4. it is a simpler and more easily scaled method than comparable methods that rely on chemistry; and,
5. it is already used for all metal depositions in TFT-LCD production.

Given the significant reduction of OH groups in sputtered SiO2 films, the present invention system is very suitable for improving the bulk electronic properties (quality) of the formed layers. Furthermore, by utilizing a continuous (sequential) deposition mode, a silicon film can be deposited on top of the base coat film without breaking vacuum. Maintaining the vacuum eliminates a potential source of water. No water is absorbed in the base coat, as the film is not exposed to ambient conditions between deposition steps. Hence, no separate annealing step is required to remove water absorbed in the base coat between deposition processes. Further, as a result of sputtering the base coat and sequentially sputtering the thin film of silicon, the step of dehydrogenation is also eliminated, as PVD-Si has very low H2 content.

Figure 3:
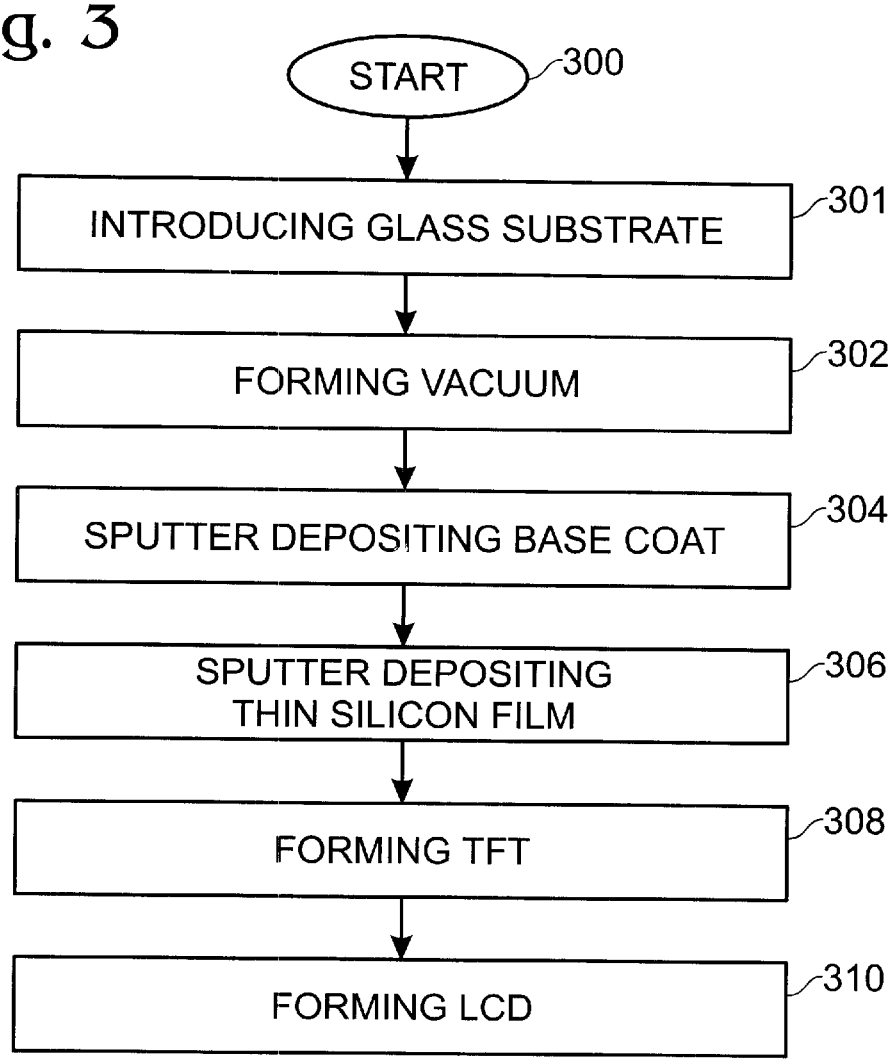
FIG. 3 is a flowchart illustrating the present invention method for forming a thin film of silicon overlying a barrier layer in a continuous process.

FIG. 3 is a flowchart illustrating the present invention method for forming a thin film of silicon overlying a barrier layer in a continuous process. Although the method is depicted as a sequence of numbered steps for clarity, no order should be inferred from the numbering unless explicitly stated. The method starts at Step 300. Step 302 forms a vacuum seal. Step 304 sputter deposits a barrier layer. Step 306, without breaking the vacuum seal, sputter deposits a thin film of silicon overlying the barrier layer. Typically, the method includes a further step, Step 301 of introducing a glass substrate. Then, sputter depositing a barrier layer in Step 304 includes sputter depositing a base coat overlying the glass substrate.

Sputter depositing a thin film of silicon overlying the barrier layer in Step 306 includes forming a thin film from the group including amorphous silicon (a-Si) and polysilicon (p-Si). Sputter depositing a barrier layer in Step 304 includes sputter depositing a base coat of silicon dioxide. Sputter depositing a base coat in Step 304 includes sputter depositing a base coat of silicon dioxide having a thickness in the range of 100 to 1000 nanometers (nm). Preferably, the thickness is in the range of 100 to 500 nm. Even more preferably, the thickness is in the range of 100 to 300 nm.

Sputter depositing a base coat in Step 304 includes sputter depositing silicon dioxide with a process selected from the group including direct current (DC) magnetron sputtering and radio frequency (RF) sputtering. When the base coat is deposited with a DC magnetron process, the atmosphere includes argon and oxygen. In some aspects of the invention Ar can be replaced by another inert gas selected from the group including Ne and Kr. In some other aspects of the invention, the atmosphere additionally includes helium gas. In other aspects, the atmosphere additionally includes hydrogen.

Sputter depositing a base coat in Step 304 includes sputter depositing a base coat using a target material selected from the group including single-crystal silicon, polycrystalline silicon, and doped silicon. Typically, the doped silicon target material is a p-doped material having a resistivity in the range of 1 to 500 ohms per centimeter.

When the base coat is deposited in Step 304 with an RF sputtering process, the atmosphere includes Ar and oxygen. In some aspects of the invention, the atmosphere additionally includes helium. The base coat layer is sputter deposited using a target material of silicon dioxide or silicon.

Sputter depositing a thin film of silicon overlying the base coat in Step 306 includes sputter depositing with a DC magnetron process in an atmosphere of Ar. In another aspect of the invention the sputtering atmosphere consists of a mixture of He and Ar. Sputter depositing a thin film of silicon overlying the base coat includes sputter depositing using a target material selected from the group including single-crystal silicon, polycrystalline silicon, and doped silicon. Typically, the doped silicon target material is a p-doped material having a resistivity in the range of 1 to 500 ohms per centimeter.

In some aspects of the invention, the method includes further steps. Step 308 forms a TFT active area from the thin film of silicon formed in Step 306. Step 310 forms a liquid crystal display (LCD) from the TFT of Step 308.

Figure 4:
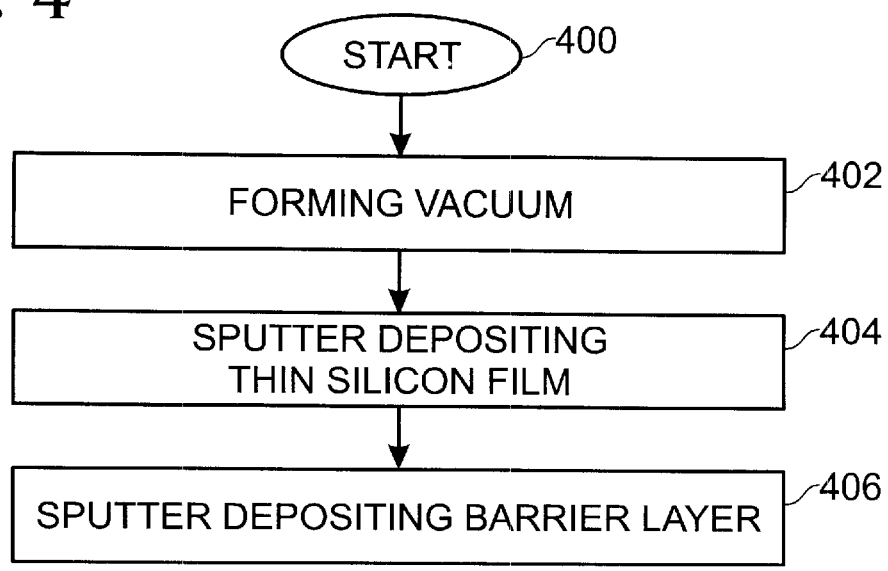
FIG. 4 is a flowchart illustrating the present invention method for forming a barrier layer overlying a thin film of silicon in a continuous process.

FIG. 4 is a flowchart illustrating the present invention method for forming a barrier layer overlying a thin film of silicon in a continuous process. The method of FIG. 3 generally describes a process that could be used for the formation of a bottom gate TFT. The present method is intended to cover either more general processes, or processes where the barrier layer is formed over the thin silicon film. The method begins at Step 400. Step 402 forms a vacuum seal. Step 404 sputter deposits a thin film of silicon. Step 406, without breaking the vacuum seal, sputter deposits a barrier layer overlying the thin film of silicon.

Sputter depositing a thin film of silicon in Step 404 includes forming a thin film of amorphous silicon (a-Si) or polysilicon (p-Si). Sputter depositing a barrier layer in Step 406 includes sputter depositing a barrier layer of silicon dioxide.

A system and method have been presented for sequentially sputter depositing a thin film of silicon over a base coat barrier layer, so that the vacuum seal is not broken between the two deposition processes. A specific example of a glass substrate/base coat/silicon film structure has been given, but the present invention is applicable to the formation of more complex, yet related structures. Other variations and embodiments will occur to those skilled in the art.

We claim:

1. In the fabrication of thin film transistors (TFTs), a method for forming a thin film of silicon overlying a barrier layer in a continuous process, the method comprising:

introducing a glass substrate;

forming a vacuum seal;

sputter depositing a barrier layer of silicon dioxide base coat overlying the glass substrate;

without breaking the vacuum seal, sputter depositing a thin film of silicon overlying the barrier layer;

wherein sputter depositing a barrier layer includes sputter depositing a base coat using a DC magnetron process in an atmosphere including oxygen and helium, and a gas selected from the group consisting of Ar, Ne, and Kr; and, wherein sputter depositing a thin film of silicon overlying the barrier layer includes forming a thin film from the group of materials consisting of amorphous silicon (a-Si) and polysilicon (p-Si).

2. The method of claim 1 wherein the atmosphere additionally includes hydrogen.

3. The method of claim 1 wherein sputter depositing a base coat includes sputter depositing a base coat using a target material selected from the group consisting of single-crystal silicon, polycrystalline silicon, and doped silicon.

4. The method of claim 3 wherein the doped silicon target material is a p-doped material having a resistivity in the range of 1 to 500 ohms per centimeter.

5. The method of claim 1 wherein sputter depositing a base coat includes sputter depositing a base coat of silicon dioxide having a thickness in the range of 100 to 1000 nanometers (nm).

6. The method of claim 5 wherein sputter depositing a base coat includes sputter depositing a base coat of silicon dioxide having a thickness in the range of 100 to 500 nm.

7. The method of claim 6 wherein sputter depositing a base coat includes sputter depositing a base coat of silicon dioxide having a thickness in the range of 100 to 300 nm.

8. In the fabrication of thin film transistors (TFTs), a method for forming a thin film of silicon overlying a barrier layer in a continuous process, the method comprising:

introducing a glass substrate;

forming a vacuum seal;

sputter depositing a barrier layer of silicon dioxide base coat overlying the glass substrate;

without breaking the vacuum seal, sputter depositing a thin film of silicon overlying the barrier layer;

wherein sputter depositing a barrier layer includes sputter depositing a base coat using an RF sputtering process in an atmosphere including oxygen, Ar, and helium; and, wherein sputter depositing a thin film of silicon overlying the barrier layer includes forming a thin film from the group of materials consisting of amorphous silicon (a-Si) and polysilicon (p-Si).

9. The method of claim 8 wherein sputter depositing a base coat includes sputter depositing a base coat using a target material selected from the group consisting of silicon and silicon dioxide.

10. The method of claim 8 wherein sputter depositing a base coat includes sputter depositing a base coat of silicon dioxide having a thickness in the range of 100 to 1000 nanometers (nm).

11. The method of claim 10 wherein sputter depositing a base coat includes sputter depositing a base coat of silicon dioxide having a thickness in the range of 100 to 500 nm.

12. The method of claim 11 wherein sputter depositing a base coat includes sputter depositing a base coat of silicon dioxide having a thickness in the range of 100 to 300 nm.

13. In the fabrication of thin film transistors (TFTs), a method for forming a thin film of silicon overlying a barrier layer in a continuous process, the method comprising:

introducing a glass substrate;

forming a vacuum seal;

sputter depositing a barrier layer of silicon dioxide base coat overlying the glass substrate;

without breaking the vacuum seal, sputter depositing a thin film of silicon overlying the barrier layer; and, wherein sputter depositing a thin film of silicon overlying the barrier layer includes forming a thin film from the group of materials consisting of amorphous silicon (a-Si) and polysilicon (p-Si) using a DC magnetron process in an atmosphere of helium mixed with Ar.

14. The method of claim 13 wherein sputter depositing a thin film of silicon overlying the base coat includes sputter depositing using a target material selected from the group consisting of single-crystal silicon, polycrystalline silicon, and doped silicon.

15. The method of claim 14 wherein the doped silicon target material is a p-doped material having a resistivity in the range of 1 to 500 ohms per centimeter.

16. In the fabrication of thin film transistors (TFTs), a system for forming a barrier layer and a thin film of silicon in a continuous process, the system comprising:

a first chamber direct current (DC) magnetron device for sputter depositing a barrier layer of silicon dioxide base coat overlying a glass substrate, the first chamber having a gas introduction port and gas exhaust port to supply a first atmosphere including oxygen and helium, and a gas selected from the group consisting of Ar, Ne, and Kr, maintained at a first base pressure, and a load/unload port;

a second chamber for sputter depositing a thin film of silicon, selected from the group consisting of amorphous silicon (a-Si) and polysilicon (p-Si), overlying the barrier layer formed in the first chamber, the second chamber having an atmosphere maintained at the first base pressure and a load/unload port connected to the first chamber load/unload port, to permit communication between the first and second chambers without breaking the seal of the first base pressure vacuum.

17. The system of claim 16 wherein the first chamber gas introduction and gas exhaust ports supply an atmosphere additionally including hydrogen.

18. The system of claim 16 wherein the first chamber DC magnetron device includes a target selected from the group of materials consisting of single-crystal silicon, polycrystalline silicon, and doped silicon.

19. The system of claim 18 wherein the first chamber DC magnetron device target is a p-doped material having a resistivity in the range of 1 to 500 ohms per centimeter.

20. The system of claim 16 wherein the first chamber deposits a base coat of silicon dioxide having a thickness in the range of 100 to 1000 nanometers (nm).

21. The system of claim 20, wherein the first chamber deposits a base coat of silicon dioxide having a thickness in the range of 100 to 500 nm.

22. The system of claim 21 wherein the first chamber deposits a base coat of silicon dioxide having a thickness in the range of 100 to 300 nm.

23. In the fabrication of thin film transistors (TFTs), a system for forming a barrier layer and a thin film of silicon in a continuous process, the system comprising:

a first chamber radio frequency (RF) sputtering device for sputter depositing a barrier layer of silicon dioxide base coat overlying a glass substrate, the first chamber having a gas introduction port and gas exhaust port to supply a first atmosphere including oxygen, Ar, and helium, maintained at a first base pressure, and a load/unload port;

a second chamber for sputter depositing a thin film of silicon, selected from the group consisting of amorphous silicon (a-Si) and polysilicon (p-Si), overlying the barrier layer formed in the first chamber, the second chamber having an atmosphere maintained at the first base pressure and a load/unload port connected to the first chamber load/unload port, to permit communication between the first and second chambers without breaking the seal of the first base pressure vacuum.

24. The system of claim 23 wherein the first chamber RE sputtering device includes a target material selected from the group consisting of silicon and silicon dioxide.

25. The system of claim 23 wherein the first chamber deposits a base coat of silicon dioxide having a thickness in the range of 100 to 1000 nm.

26. The system of claim 25 wherein the first chamber deposits a base coat of silicon dioxide having a thickness in the range of 100 to 500 nm.

27. The system of claim 26 wherein the first chamber deposits a base coat of silicon dioxide having a thickness in the range of 100 to 300 nm.

28. In the fabrication of thin film transistors (TFTs), a system for forming a barrier layer and a thin film of silicon in a continuous process, the system comprising:

a first chamber for sputter depositing a barrier layer of silicon dioxide base coat overlying a glass substrate, the first chamber having an atmosphere maintained at a first base pressure, and a load/unload port;

a second chamber DC magnetron device for sputter depositing a thin film of silicon, selected from the group consisting of amorphous silicon (a-Si) and polysilicon (p-Si), overlying the barrier layer formed in the first chamber, the second chamber having a gas introduction port and gas exhaust port to supply an atmosphere including Ar and helium maintained at the first base pressure, and a load/unload port connected to the first chamber load/unload port, to permit communication between the first and second chambers without breaking the seal of the first base pressure vacuum.

29. The system of claim 28 wherein the second chamber DC magnetron device includes a target selected from the group of materials consisting of single-crystal silicon, polycrystalline silicon, and doped silicon.

30. The system of claim 29 wherein the second chamber DC magnetron device target is a p-doped material having a resistivity in the range of 1 to 500 ohms per centimeter.

* * * * *